(12) United States Patent
Hong (10) Patent No.: US 9,373,379 B2
(45) Date of Patent: Jun. 21, 2016

(54) ACTIVE CONTROL DEVICE AND SEMICONDUCTOR DEVICE INCLUDING THE SAME

(71) Applicant: SK hynix Inc., Incheon-si Gyeonggi-do (KR)

(72) Inventor: Duck Hwa Hong, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 70 days.

(21) Appl. No.: 14/074,933

(22) Filed: Nov. 8, 2013

(65) Prior Publication Data

US 2015/0043297 A1   Feb. 12, 2015

(30) Foreign Application Priority Data

Aug. 7, 2013   (KR) .................. 10-2013-0093724

(51) Int. Cl.
*G11C 8/06* (2006.01)
*G11C 8/10* (2006.01)
*G11C 8/18* (2006.01)

(52) U.S. Cl.
CPC .. *G11C 8/10* (2013.01); *G11C 8/06* (2013.01); *G11C 8/18* (2013.01)

(58) Field of Classification Search
CPC .................... G11C 8/06; G11C 8/18
USPC .................................. 365/230.03
See application file for complete search history.

(56) References Cited

U.S. PATENT DOCUMENTS

| | | | | |
|---|---|---|---|---|
| 5,528,552 A * | 6/1996 | Kamisaki | ........... | G11C 11/4082 365/230.03 |
| 5,999,472 A * | 12/1999 | Sakurai | ............ | G11C 11/40618 365/222 |
| 7,133,996 B2 | 11/2006 | Ikeda et al. | | |
| 8,024,629 B2 | 9/2011 | Louie et al. | | |
| 2003/0227800 A1* | 12/2003 | Saito | ........................ | G11C 8/12 365/200 |
| 2009/0116330 A1* | 5/2009 | Yang | ......................... | 365/230.08 |
| 2009/0225623 A1* | 9/2009 | Walker | ........................ | 365/238.5 |
| 2012/0250433 A1* | 10/2012 | Jeon | ................................ | 365/193 |
| 2013/0223177 A1* | 8/2013 | Cho | ........................ | 365/230.06 |
| 2014/0254300 A1* | 9/2014 | Walker | ........................ | 365/238.5 |

* cited by examiner

*Primary Examiner* — Hoai V Ho
*Assistant Examiner* — Jay Radke
(74) *Attorney, Agent, or Firm* — William Park & Associates Ltd.

(57) ABSTRACT

An active control device and a semiconductor device including the same are disclosed, which can control an active command in response to a pin change of a command address. The active control device includes: a bank decoding unit configured to decode a bank address to output a bank selection signal; an active controller configured to output a first active control signal, a second active control signal, and an active delay signal to control an active operation of a bank in response to the bank selection signal, a first active signal, and a second active signal; an address latch unit configured to latch a row address to output an address delay signal; and an address output unit configured to output an address corresponding to the address delay signal.

20 Claims, 7 Drawing Sheets

ACTIVE CONTROL DEVICE AND SEMICONDUCTOR DEVICE INCLUDING THE SAME

CROSS-REFERENCE TO RELATED APPLICATION

This application claims priority based upon Korean patent application No. 10-2013-0093724, filed on Aug. 7, 2013, the disclosure of which is hereby incorporated in its entirety by reference herein.

BACKGROUND

1. Technical Field

Embodiments of the invention relate to an active control device and a semiconductor device including the same, and more particularly to a technology for controlling an active command in response to a pin/pad change of a command address.

2. Description of Related Art

Typically, a semiconductor memory device includes a plurality of banks. Each bank is a functional unit capable of performing independent access, and includes a memory cell array, a sense-amplifier (sense-amp) array, an address decoder, etc.

Generally, when accessing a specific memory cell of a specific bank, an active command for controlling a row line is applied to the specific memory cell of the specific bank so as to activate a row line (word line) of the corresponding bank. Subsequently, read/write commands for controlling a column line are applied to the memory cell so that sense-amplifying and restoring processes of a specific column (bit line) are carried out. Thereafter, after completion of the operation for accessing the corresponding bank, a precharge command is applied to the memory cell such that a row line of the corresponding bank is deactivated.

The semiconductor memory device may generate an internal command signal by combining external commands, for example, a chip selection signal (/CS), a RAS signal (/RAS), a CAS signal (/CAS), a write enable signal (/WE), etc. A circuit for generating an internal command signal is referred to as a command decoder.

However, a chip size is gradually reduced according to a tech-shrink, such that the number of pads is also gradually reduced in proportion to the reduced chip size. In addition, many people and developers are conducting intensive research into a method for reducing production costs by reducing the number of wire bonding pins during packaging of the semiconductor device as the number of channels is gradually reduced. However, in order to reduce the number of wire bonding pins, there is a need to reduce the number of command address pins.

If the number of command address pins is reduced, the amount of input data capable of being simultaneously received is reduced. Accordingly, several command signals should be input to the semiconductor memory device over time such that the corresponding address can be applied to the semiconductor memory device.

For example, a row address RA<0:14>, a bank address BA<0:2>, and an active command address ADD<0:N> should be applied to at least LPDDR4 specification of 8-bank device having 8 gigabits density. In this case, if the number of command address pins is reduced to 8 pins, the active command must be input to the semiconductor memory device for a minimum of 4 clocks in such a manner that a row active command can be normally input and a desired address can be selected.

The conventional semiconductor device is configured to perform a row access operation by only one active command. However, at least two active commands in response to the reduced number of command address pins should be applied to the conventional semiconductor device so as to perform the row address operation.

SUMMARY

Various embodiments of the invention are directed to providing an active control device and a semiconductor device including the same that substantially obviate one or more problems due to limitations and disadvantages of the related art.

An embodiment of the invention relates to an active control device and a semiconductor device including the same, which can control bank active generation and address latching in response to a pin change of a command address, such that the active operation can be controlled in response to a changed specification.

In accordance with an aspect of an embodiment, an active control device includes: a bank decoding unit configured to decode a bank address to output a bank selection signal; an active controller configured to output a first active control signal, a second active control signal, and an active delay signal so as to control an active operation of a bank in response to the bank selection signal, a first active signal, and a second active signal; an address latch unit configured to latch a row address to output an delayed address signal; and an address output unit configured to output an address corresponding to the delayed address signal.

In accordance with an aspect of an embodiment, a semiconductor device includes: a bank decoding unit configured to decode a bank address in response to a first active command signal and a second active command signal so as to output a bank selection signal; an active controller configured to output a first active control signal, a second active signal, and an active delay signal so as to control an active operation of a bank in response to the bank selection signal, a first active signal, and a second active signal; an address latch unit configured to latch a row address in response to the first active control signal and the second active control signal so as to output an delayed address signal; an address output unit configured to output an address corresponding to the delayed address signal in response to the active delay signal; and a core region configured to receive the address, and perform a specific operation corresponding to the address.

In accordance with an aspect of an embodiment, an active control device includes: a bank decoding unit configured to decode a bank address in response to a plurality of active command signals and output a bank selection signal; an active controller configured to output a first active control signal, a second active control signal, and an active delay signal to control an active operation of a bank; an address latch unit configured to latch a plurality of row addresses and output one or more delayed address signals; and an address output unit configured to output a selected address to a core region.

It is to be understood that both the foregoing general description and the following detailed description of the invention are explanatory and are intended to provide further explanation of the invention as claimed.

BRIEF DESCRIPTION OF THE DRAWINGS

The above and other features and advantages of the invention will become readily apparent by reference to the following detailed description when considered in conjunction with the accompanying drawings wherein.

DETAILED DESCRIPTION

Reference will now be made in detail to embodiments of the invention, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Figure 1:
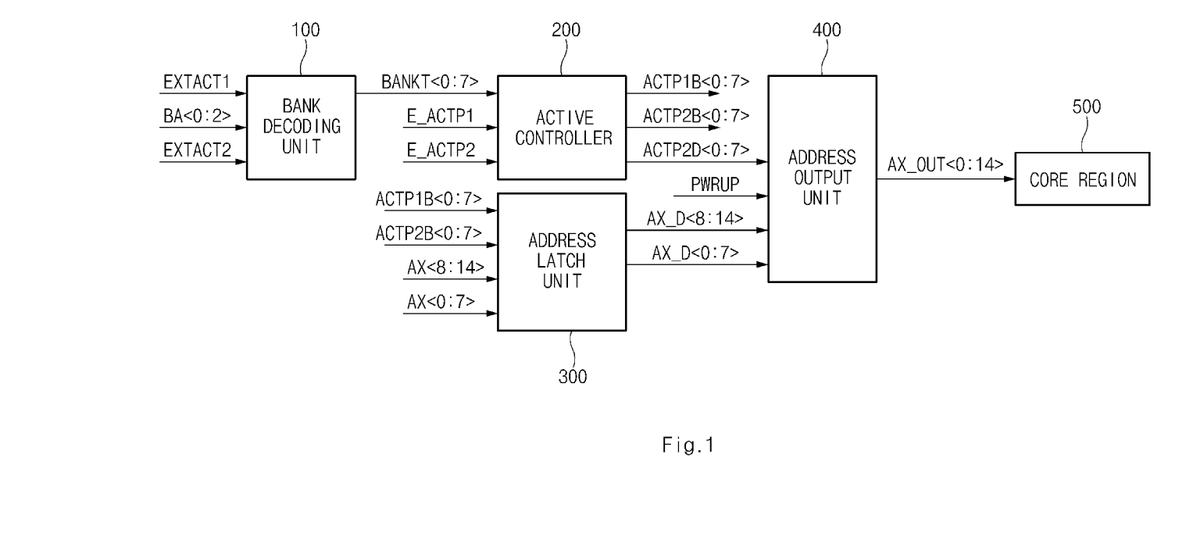
FIG. 1 is a block diagram illustrating a semiconductor device according to an embodiment.

FIG. 1 is a block diagram illustrating a semiconductor device according to an embodiment.

Referring to FIG. 1, the semiconductor device includes a bank decoding unit 100, an active controller 200, an address latch unit 300, an address output unit 400, and a core region 500.

In this case, the bank decoding unit 100 may decode a bank address BA<0:2> in response to active command signals (EXTACT1, EXTACT2), and thus output a bank selection signal BANKT<0:7>. The active controller 200 may output active control signals (ACTP1B, ACTP2B) and an active delay signal (ACTP2D) so as to control an active operation of the corresponding bank in response to the bank selection signal BANKT<0:7> and active signals (E_ACTP1, E_ACTP2).

In addition, the address latch unit 300 may latch a row address AX<0:7> of a first group and a row address AX<8:14> of a second group in response to active control signals (ACTP1B, ACTP2B), and thus output delayed address signals (AX_D<0:7>, AX_D<8:14>). The address output unit 400 may output a selected address (AX_OUT) corresponding to the delayed address signals (AX_D<0:7>, AX_D<8:14>) to the core region 500 upon receiving an active delay signal (ACTP2D), delayed address signals (AX_D<0:7>, AX_D<8:14>), and a power-up signal (PWRUP).

The core region 500 may perform a specific operation corresponding to an address (AX_OUT) received from the address output unit 400. In this case, the core region 500 includes 8 banks. The operation corresponding to the address (AX_OUT) may be a read/write active operation or a precharge operation.

Figure 2:
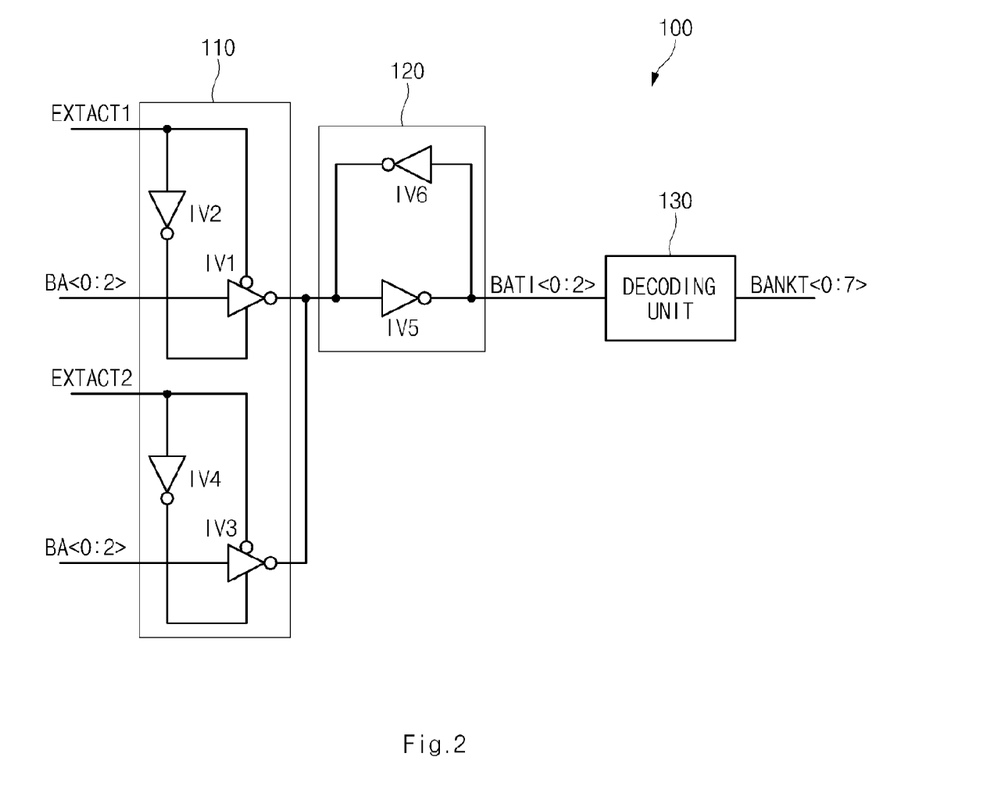
FIG. 2 is a detailed circuit diagram illustrating a bank decoding unit shown in FIG. 1.

FIG. 2 is a detailed circuit diagram illustrating the bank decoding unit 100 shown in FIG. 1.

Referring to FIG. 2, the bank decoding unit 100 may include a bank address input unit 110, a latch unit 120, and a decoding unit 130.

The bank address input unit 110 may selectively output and drive a bank address BA<0:2> in response to the active command signals (EXTACT1, EXTACT2). The inverters (IV1, IV2) may be configured to invert the bank address BA<0:2> in response to a current state of the active command signal (EXTACT1). The inverters (IV3, IV4) may be configured to invert a bank address BA<0:2> in response to a current state of the active command signal (EXTACT2).

In addition, the latch unit 120 includes inverters (IV5, IV6), input/output (I/O) terminals of which are interconnected. The latch unit 120 may latch an output signal of the bank address input unit 110 for a predetermined time so as to output a bank latch signal BATI<0:2>. The decoding unit 130 may decode the bank latch signal BATI<0:2> so as to output the bank selection signal BANKT<0:7>. Here, 8 bank selection signals BANKT<0:7> may respectively correspond to 8 banks of the core region 500.

In other words, if the active command signal (EXTACT1) transitions to a low level, the bank address BA<0:2> is input to the bank address input unit 110 by activation of the inverter IV1. In this case, bank information generated from the inverter IV1 may differ from bank information generated from the inverter IV3.

Figure 3:
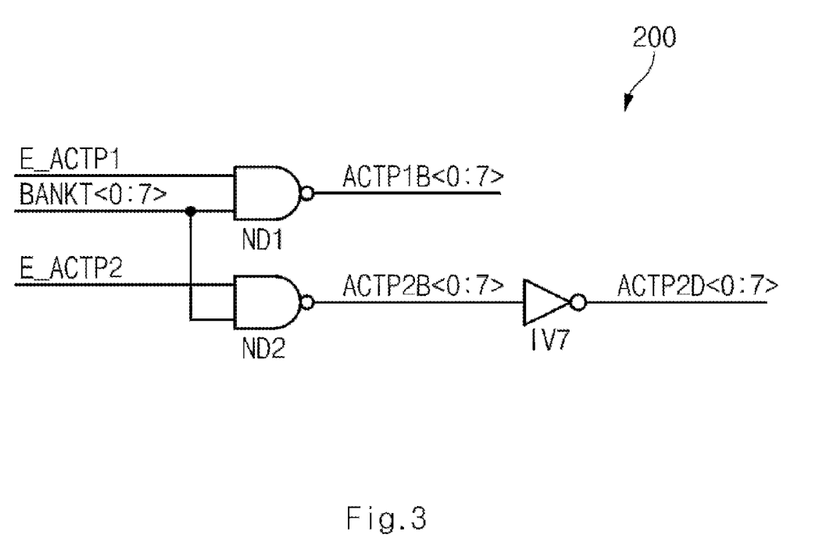
FIG. 3 is a detailed block diagram illustrating an active controller shown in FIG. 1.

FIG. 3 is a detailed block diagram illustrating the active controller 200 shown in FIG. 1.

Referring to FIG. 3, the active controller 200 may include a plurality of NAND gates (ND1, ND2) and an inverter IV7. The NAND gate ND1 may perform a NAND operation between a bank selection signal (BANKT) and an active signal (E_ACTP1) so as to output an active control signal (ACTP1B). The NAND gate ND2 may perform a NAND operation between the bank selection signal (BANKT) and the active signal (E_ACTP2) so as to output an active control signal (ACTP2B). The inverter IV7 may invert the active control signal (ACTP2B) so as to output an active delay signal (ACTP2D).

That is, assuming that the bank selection signal (BANKT) and the active signal (E_ACTP1) are at a high level, the active controller 200 may activate and output the active control signal (ACTP1B) of a low level by combining the NAND gate ND1 with the high-level bank selection signal (BANKT) and the high-level active signal (E_ACTP1). Assuming that the bank selection signal (BANKT) and the active signal (E_ACTP2) are at a high level, the active controller 200 may activate and output a low-level active control signal (ACTP2B) by combining the NAND gate ND2 with the high-level bank selection signal (BANKT) and the high-level active signal (E_ACTP2), and may activate and output a high-level active delay signal (ACTP2D).

Figure 4:
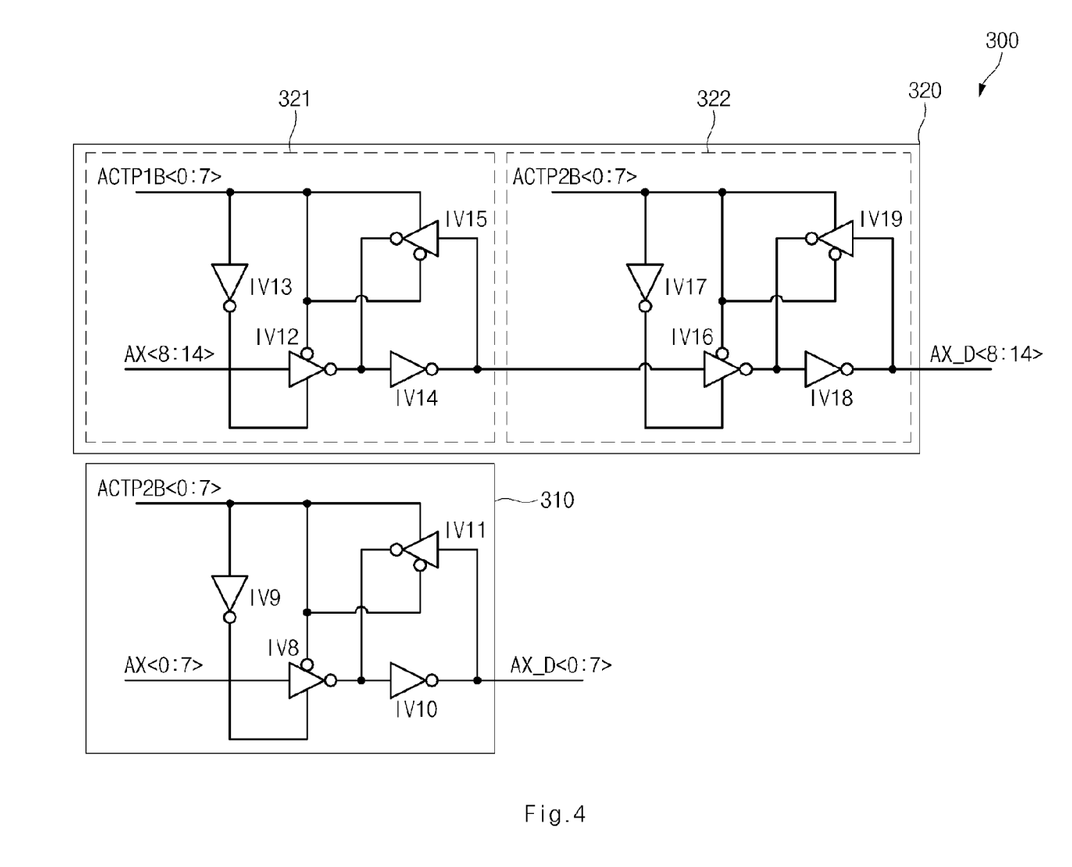
FIG. 4 is a detailed block diagram illustrating an address latch unit shown in FIG. 1.

FIG. 4 is a detailed block diagram illustrating the address latch unit 300 shown in FIG. 1.

Referring to FIG. 4, the address latch unit 300 may include a first latch unit 310 and a second latch unit 320. The first latch unit 310 may latch a row address (AX<0:7>) of a first group in response to an active control signal (ACTP2B) so as to output an delayed address signal (AX_D<0:7>). The first latch unit 310 may include a plurality of inverters (IV8-IV11) having a latch structure. Here, the inverter IV8 may invert the row address (AX<0:7>) in response to a current state of the active control signal (ACTP2B). The inverters (IV10, IV11) may latch the output signal of the inverter IV8 in response to the active control signal (ACTP2B), and thus selectively output the delayed address signal (AX_D<0:7>).

The second latch unit 320 may include a latch unit 321 and a latch unit 322. In this case, the latch unit 321 may latch a row address (AX<8:14>) of a second group in response to the active control signal (ACTP1B). The latch unit 322 may latch an output signal of the latch unit 321 in response to the active control signal (ACTP2B) so as to output the delayed address signal (AX_D<8:14>) corresponding to the row address (AX<8:14>) latched by the active control signal (ACTP2B).

The second latch unit 320 may include a plurality of inverters IV12-IV15) having a latch structure, and a plurality of inverters IV16-IV19). In this case, the inverter IV12 may invert the row address (AX<8:14>) in response to a current state of the active control signal (ACTP1B). The inverters (IV14, IV15) may selectively latch the output signal of the inverter IV12 in response to the active control signal (ACTP1B).

The inverter IV16 may invert the output signal of the inverter IV14 in response to a current state of the active control signal (ACTP2B). The inverters (IV18, IV19) may latch an output signal of the inverter IV16 in response to the active control signal (ACTP2B) so as to selectively output the delayed address signal (AX_D<8:14>).

The above-mentioned embodiment has disclosed that a total number of row address bits (AX) is set to 15 for convenience of description and better understanding of the invention. However, the scope or spirit of the invention is not limited thereto, and the number of row address bits may be changed according to the number of banks or the number of other constituent elements as necessary.

The address latch unit 300 may pre-store or latch the second group row address (AX<8:14>) in the latch unit 321 of the second latch unit 320 when the active control signal (ACTP1B) is activated, and the second group row address AX<8:14> stored in the latch unit 320 and the first group row address AX<0:7> stored in the first latch unit 310 are simultaneously output at an activation time of the active control signal (ACTP2B).

Figure 5:
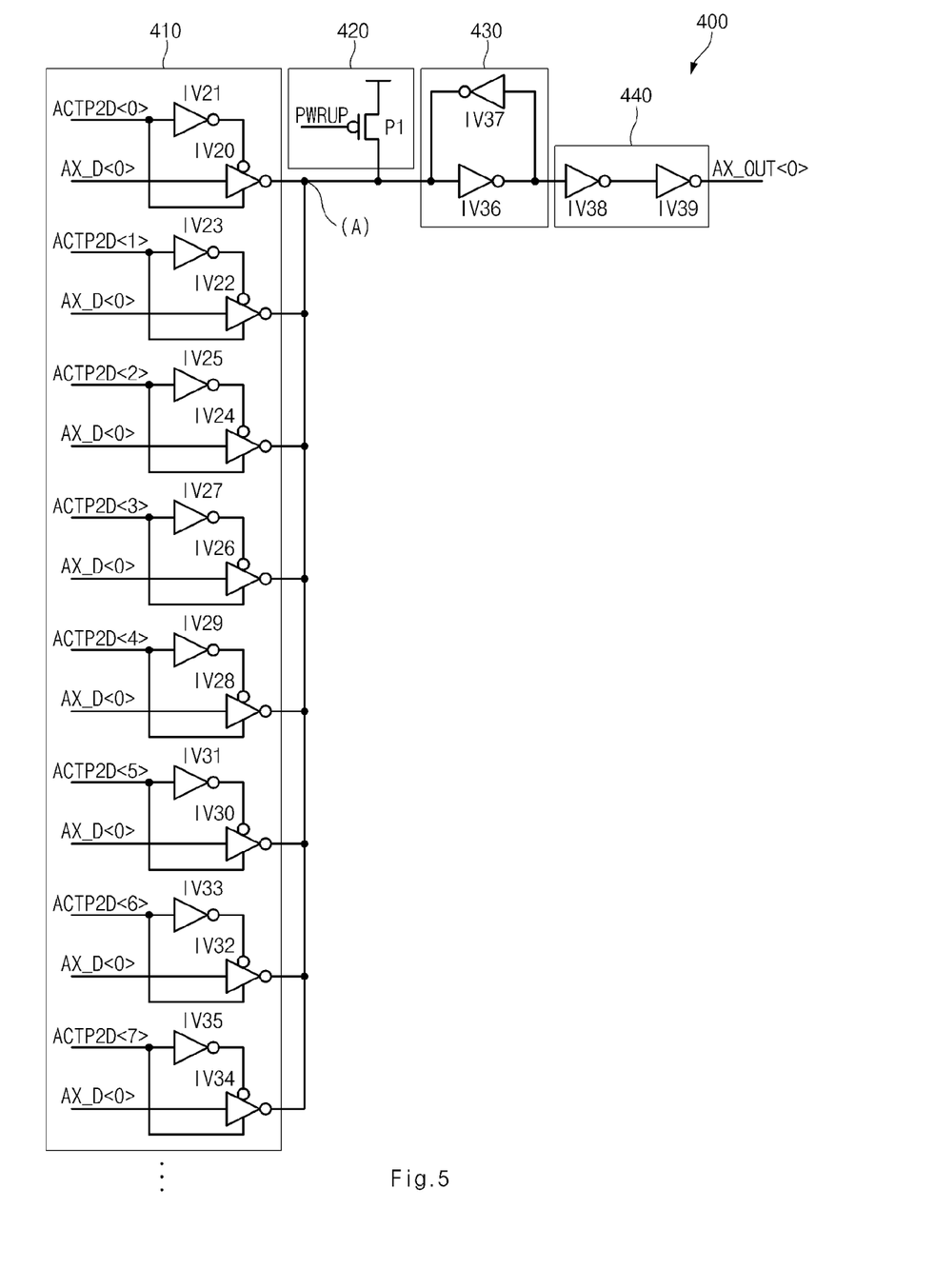
FIG. 5 is a detailed block diagram illustrating an address output unit shown in FIG. 1.

FIG. 5 is a detailed block diagram illustrating the address output unit 400 shown in FIG. 1.

Referring to FIG. 5, the address output unit 400 includes an address selection unit 410, an initialization unit 420, a latch unit 430, and a delay unit 440.

The address selection unit 410 may include a plurality of inverters IV20-IV35). The output signal of each inverter of the address selection unit 410 may be coupled to a node A.

The inverter IV20 may selectively output an delayed address signal (AX_D<0>) in response to a current state of the active delay signal (ACTP2D). The inverter IV22 may selectively output an delayed address signal (AX_D<1>) in response to a current state of the active signal (ACTP2D). The inverter IV24 may selectively output an delayed address delay signal (AX_D<2>) in response to a current state of the active delay signal (ACTP2D). The inverter IV26 may selectively output an delayed address signal (AX_D<3>) in response to a current state of the active delay signal (ACTP2D).

The inverter IV28 may selectively output an delayed address signal (AX_D<4>) in response to a current state of the active delay signal (ACTP2D). The inverter IV30 may selectively output an delayed address signal (AX_D<5>) in response to a current state of the active delay signal (ACTP2D). The inverter IV32 may selectively output an delayed address signal (AX_D<6>) in response to a current state of the active delay signal (ACTP2D). In the same manner as described above, the inverter IV34 may selectively output an delayed address signal (AX_D<14>) in response to a current state of the active delay signal (ACTP2D).

The above-mentioned address selection unit 410 may output an delayed address delay signal (AX_D<0:14>) to the node A when the active delay signal (ACTP2D) is activated to a high level.

The initialization unit 420 may include a PMOS transistor P1. The PMOS transistor P1 is coupled between a power-supply voltage unit and the node A so as to receive a power-up signal (PWRUP) through a gate terminal. The initialization unit 420 may be configured to initialize the output signal of the address selection unit 410 in response to the power-up signal (PWRUP).

The latch unit 430 may include a plurality of inverters (IV36, IV37) interconnected to have a latch structure. The latch unit 430 may latch the output signal of the address selection unit 410 and the node A for a predetermined period of time. A delay unit 440 may include a plurality of inverters (IV38, IV39). The delay unit 440 may perform non-invert delaying of the output signal of the latch unit 430 for a predetermined time, and thus output an address AX_OUT to the core region 500.

Figure 6:
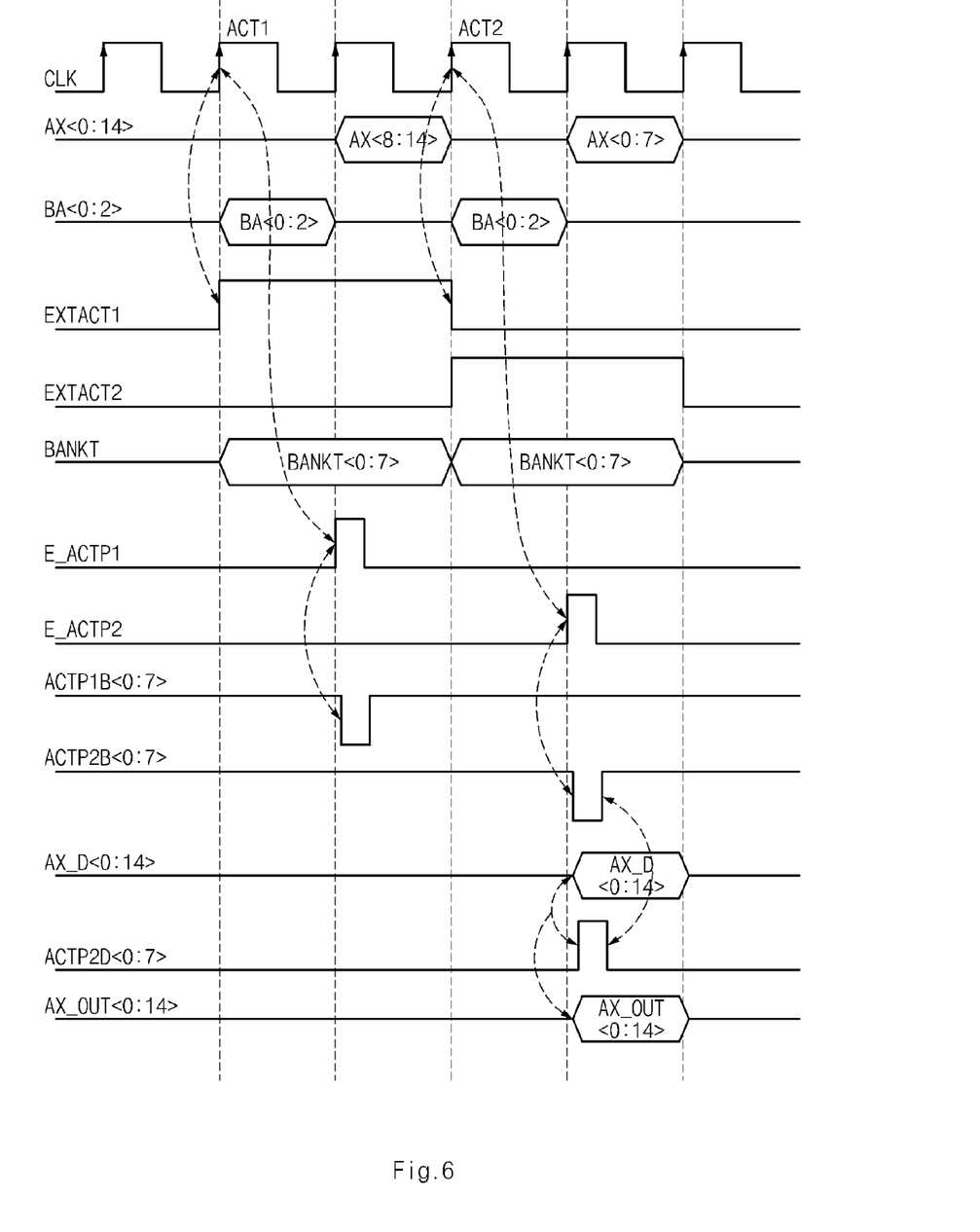
FIG. 6 is a timing diagram illustrating operations of the semiconductor device according to an embodiment.

FIG. 6 is a timing diagram illustrating operations of the semiconductor device according to an embodiment. The operation process of the semiconductor device according to an embodiment will hereinafter be described with reference to the timing diagram of FIG. 6.

In order to input the active command to the semiconductor device, information regarding the number of bank addresses and information regarding the number of row addresses must be input to the semiconductor device. Accordingly, it is difficult for the semiconductor device to receive necessary information through only one command signal, and two or more active commands must be input to the semiconductor device.

The bank decoding unit 100 may decode the bank address BA<0:2> in response to the active command signals (EXTACT1, EXTACT2). Here, assuming that the bank decoding unit 100 receives a high-level active command (ACT1, ACT2) from an external part, the active command signals (EXTACT1, EXTACT2) may transition to the active state.

The active command signals (EXTACT1, EXTACT2) may be activated to a high level at periods of a predetermined time. In other words, the active command signal (EXTACT1) may be activated to a high level earlier than the active command signal (EXTACT2). When the active command signal (EXTACT1) is deactivated to a low level, the active command signal (EXTACT2) is activated to a high level.

Accordingly, the active command signal (EXTACT1) may transition to a high level at a first clock (CLK) in response to a first active command (ACT1). The bank decoding unit 100 may decode the bank address BA<0:2> so as to output a bank selection signal (BANKT<0:7>). After the bank address BA<0:2> is input to the bank decoding unit 100, the bank decoding unit 100 is synchronized with a period of the next clock signal (CLK), such that a row address AX<8:14> of the second group is first input to the address latch unit 300.

The active controller 200 may combine the active signal (E_ACTP1) with the bank selection signal (BANKT<0:7>) so as to output an active control signal (ACTP1B). In this case, the active signal (E_ACTP1) is synchronized with the clock signal (CLK), and is then activated to a high level after lapse of a predetermined time after activation of the external active command (ACT1). That is, assuming that the bank selection signal (BANKT<0:7>) and the active signal (E_ACTP1) are at a high level, the active control signal (ACTP1B) may transition to a low level.

The row address (AX<8:14>) of a second group is first input to the latch unit 321 in response to an active control signal (ACTP1B), such that an address of the corresponding bank is latched. In this case, the row address (AX<8:14>) may be synchronized with the rising time of the clock signal (CLK) and then latched.

Although an address corresponding to another bank is successively input to the semiconductor device, since an independent address latch is allocated to each bank, the semiconductor device may store an address in the same manner as in the active control signal (ACTP1B).

Thereafter, when the active command signal (EXTACT1) transitions to a low level, the active command signal EXTACT2 is activated to a high level at a third clock signal (CLK) in response to a second active command (ACT2). The bank decoding unit 100 may re-decode the bank address BA<0:2>, and then output the bank selection signal (BANKT<0:7>). After the bank address (BA<0:2>) is input to the bank decoding unit 100, the bank decoding unit 100 is synchronized with a period of the next clock signal (CLK) such that the row address AX<0:7> of the first group is input to the address latch unit 300.

The active controller 200 may combine the active signal (E_ACTP2) with the bank selection signal (BANKT<0:7>) so as to output an active control signal (ACTP2B). In this case, the active signal (E_ACTP2) is synchronized with the clock signal (CLK), and is activated to a high level after lapse of a predetermined time after activation of the external active command (ACT2). That is, assuming that the bank selection signal (BANKT<0:7>) and the active signal (E_ACTP2) are at a high level, a low-level active control signal (ACTP2B) is output. As a result, the output signal of the latch unit 321 is applied to the latch unit 322 in response to the active control signal (ACTP2B), and is then latched, so that the delayed address signal (AX_D<8:14>) is output. As illustrated in FIG. 6, the active signals (E_ACTP1) and (E_ACTP2) can be activated at different time points.

In this case, when the active control signal (ACTP2B) transitions to a low level, the row address AX<0:7> of the first group latched to the first latch unit 310 is output as the delayed address signal (AX_D<0:7>). Here, the row address (AX<0:7>) may be synchronized with the rising time of the clock signal (CLK) and then latched.

Thereafter, the active controller 200 may delay and invert the active control signal (ACTP2B) using the inverter IV7, so that the active controller 200 may output a high-level active delay signal (ACTP2D). All inverters of the address selection unit 410 of the address output unit 400 are turned on, such that the delayed address signal (AX_D<0:7>) is output to the node A.

In this case, when the power-up signal (PWRUP) transitions to a low level, the PMOS transistor P1 is turned on so that the node A is initialized to a power-supply voltage level. That is, the node A is precharged with the power-supply voltage level under a power-up state, and the signal of the node A is latched to the latch unit 430 under a normal operation state.

After lapse of a delay time of the delay unit 440, an address AX_OUT<0:14> is output to the core region 500. The core region 500 may perform a read/write active operation and a precharge operation of the corresponding bank using the address AX_OUT<0:14>.

Assuming that bank information is input to the semiconductor device according to active command signals (EXTACT1, EXTACT2) and an active signal of the same bank is not successively input to the semiconductor device, each bank would have to include the address latch unit 300. Assuming that the active command signals (EXTACT1, EXTACT2) are successively input to the same bank, all the banks are able to use the same address latch unit 300.

As described above, the active control device and the semiconductor device including the same according to an embodiment may design a process for generating the bank active signal and a process for latching the address in different ways according to a change of a command address pin, such that the active control device and the semiconductor device can appropriately cope with the change of a pin without changing the specification.

In a system comprises a plurality of semiconductor devices, the memory device is used as a data storage space. If the memory controller such as a Central Processing Unit (CPU) or Graphics Processing Unit (GPU) may input a data I/O command and an address to the memory device, the memory device may store data received from the controller in a memory cell region corresponding to the input address, or may output data stored in the memory cell region corresponding to the address.

As is apparent from the above description, the active control device and the semiconductor device including the same according to embodiments can control the active operation in response to a pin change of the command address, such that the active control device and the semiconductor device including the same can appropriately cope with specification change.

Figure 7:
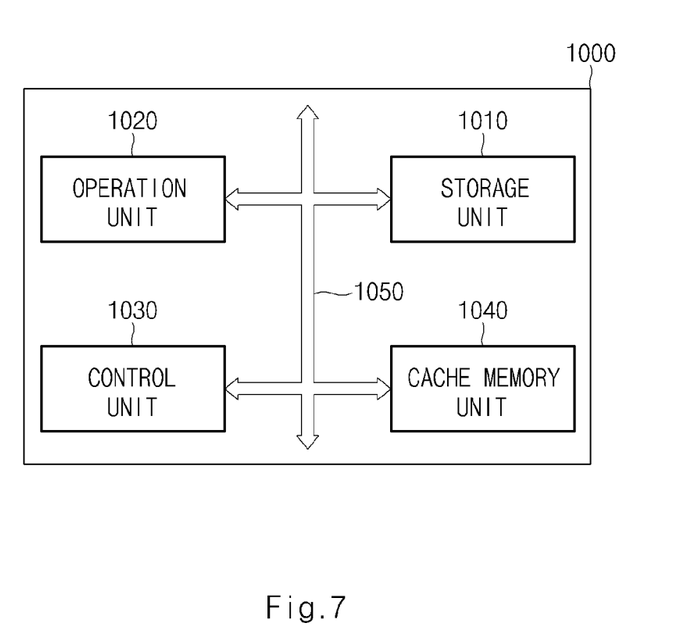
FIG. 7 is a block diagram illustrating the semiconductor device according to an embodiment of the invention.

FIG. 7 illustrates a microprocessor 1000 that may include a storage unit 1010, an operation unit 1020, and a control unit 1030. The microprocessor 1000 may be a variety of processing apparatuses, such as a central processing unit (CPU), a graphic processing unit (GPU), a digital signal processor (DSP), or an application processor (AP).

The storage unit 1010 may be a unit that may storage data in the microprocessor 1000 and include a data register, an address register, and/or various other registers. The storage unit 1010 may temporarily store data to be operated in the operation unit 1020, resulting in data performed in the operation unit 1020, and an address in which data to be operated is stored. The storage unit 1010 may include the semiconductor device and/or active control device described above.

The operation unit may perform an operation in the microprocessor 1000, and perform a variety of four fundamental rules of an arithmetic operation or a logic operation depending on a command in the control unit 1030. The operation unit 1020 may include one or more arithmetic and logic units (ALU).

The control unit 1030 receives a signal from the storage unit 1010, the operation unit 1020, or an external apparatus of the microprocessor 1000, performs extraction or decryption of a command, or input or output control, and executes a process in a program form.

The microprocessor may further include a cache memory unit 1040 suitable for temporarily storing day input from an external apparatus other than the storage unit 1010 or data to be output to an external apparatus. The cache memory unit 1040 may exchange data from the storage unit 1010, the operation unit 1020, and the control unit 1030 through a bus interface 1050.

Those skilled in the art will appreciate that the invention may be carried out in other specific ways than those set forth herein without departing from the spirit and essential characteristics of the invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An active control device comprising:
    a bank decoding unit configured to decode a bank address to output a bank selection signal;
    an active controller configured to output a first active control signal, a second active control signal, and an active delay signal so as to control an active operation of a bank in response to the bank selection signal, a first active signal, and a second active signal;
    an address latch unit configured to latch a row address in response to the first active control signal and the second active control signal, and output an delayed address signal; and
    an address output unit configured to output an address corresponding to the delayed address signal in response to the active delay signal.

2. The bank control device according to claim 1, wherein the bank decoding unit includes:
    a bank address input unit configured to selectively output the bank address in response to a first active command signal and a second active command signal;
    a latch unit configured to latch an output signal of the bank address input unit for a predetermined time, and output a bank latch signal; and
    a decoding unit configured to decode the bank latch signal so as to output the bank selection signal.

3. The active control device according to claim 1, wherein a
    first active command signal and a second active command signal are activated at different time points.

4. The active control device according to claim 1, wherein:
    if the bank selection signal and the first active signal are enabled, the active controller activates and outputs the first active control signal; and
    if the bank selection signal and the second active signal are enabled, the active controller activates and outputs the second active control signal and the active delay signal.

5. The active control device according to claim 1, wherein the first active signal and the second active signal are activated at different time points.

6. The active control device according to claim 1, wherein the address latch unit includes:
    a first latch unit configured to latch a first-group row address from among the row addresses in response to the second active control signal, and output a first delayed address signal; and
    a second latch unit configured to latch a second-group row address from among the row addresses in response to the first active control signal, and output a second delayed address signal corresponding to a row address latched by the second active control signal.

7. The active control device according to claim 6, wherein the address latch unit latches the second-group row address in response to the first active control signal, and simultaneously outputs the first-group row address and the second-group row address in response to the second active control signal.

8. The active control device according to claim 1, wherein the address output unit includes:
    an address selection unit configured to selectively output the delayed address signal in response to the active delay signal;
    a latch unit configured to latch an output signal of the address selection unit for a predetermined time; and
    a delay unit configured to delay an output signal of the latch unit for a predetermined time so as to output the address.

9. The active control device according to claim 8, wherein the address output unit further includes:
    an initialization unit configured to initialize the output signal of the address selection unit in response to a power-up signal.

10. A semiconductor device comprising:
    a bank decoding unit configured to decode a bank address to output a bank selection signal;
    an active controller configured to output a first active control signal, a second active control signal, and an active delay signal so as to control an active operation of a bank in response to the bank selection signal, a first active signal, and a second active signal;
    an address latch unit configured to latch a row address in response to the first active control signal and the second active control signal, and output an delayed address signal;
    an address output unit configured to output an address corresponding to the delayed address signal; and
    a core region configured to receive the address, and perform an operation corresponding to the address in response to the active delay signal.

11. The semiconductor device according to claim 10, wherein the bank decoding unit includes:
    a bank address input unit configured to selectively output the bank address in response to a first active command signal and a second active command signal;
    a latch unit configured to latch an output signal of the bank address input unit for a predetermined time, and output a bank latch signal; and
    a decoding unit configured to decode the bank latch signal so as to output the bank selection signal.

12. The semiconductor device according to claim 10, wherein a first active command signal and a second active command signal are activated at different time points.

13. The semiconductor device according to claim 10, wherein the address latch unit includes:
    a first latch unit configured to latch a first-group row address from among the row addresses in response to the second active control signal, and output a first delayed address signal; and
    a second latch unit configured to latch a second-group row address from among the row addresses in response to the first active control signal, and output a second delayed address signal corresponding to a row address latched by the second active control signal.

14. The semiconductor device according to claim 13, wherein the address latch unit latches the second-group row address in response to the first active control signal, and simultaneously outputs the first-group row address and the second-group row address in response to the second active control signal.

15. The semiconductor device according to claim 10, wherein the address output unit includes:
    an address selection unit configured to selectively output the delayed address signal in response to the active delay signal;

a latch unit configured to latch an output signal of the address selection unit for a predetermined time;

a delay unit configured to delay an output signal of the latch unit for a predetermined time so as to output the address; and an initialization unit configured to initialize the output signal of the address selection unit in response to a power-up signal.

16. An active control device comprising:

a bank decoding unit configured to decode a bank address in response to a plurality of active command signals and output a bank selection signal;

an active controller configured to output a first active control signal, a second active control signal and an active delay signal to control an active operation of a bank;

an address latch unit configured to latch a plurality of row addresses in response to the first active control signal and the second active control signal and output one or more delayed address signals; and an address output unit configured to output a selected address to a core region in response to the active delay signal.

17. The active control device of claim 16, wherein the active controller performs an operation between the bank selection signal and a first active signal to output the first active control signal.

18. The active control device of claim 17, wherein the active controller performs an operation between the bank selection signal and a second active signal to output the second active control signal.

19. The active control device of claim 17, wherein the active controller is configured to output the first active control signal by combining the bank selection signal and the first active signal.

20. The active control device of claim 17, wherein the active controller is configured to output the second active control signal by combining the bank selection signal and the second active signal.

* * * * *